US012581857B2

(12) United States Patent
Sato et al.

(10) Patent No.: US 12,581,857 B2
(45) Date of Patent: Mar. 17, 2026

(54) INTEGRATED THERMOELECTRIC DEVICE TO MITIGATE INTEGRATED CIRCUIT HOT SPOTS

(71) Applicant: INTEL CORPORATION, Santa Clara, CA (US)

(72) Inventors: Noriyuki Sato, Hillsboro, OR (US); Hui Jae Yoo, Hillsboro, OR (US); Kevin L. Lin, Beaverton, OR (US); Van H. Le, Beaverton, OR (US); Abhishek Anil Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1029 days.

(21) Appl. No.: 17/481,501

(22) Filed: Sep. 22, 2021

(65) Prior Publication Data

US 2023/0091603 A1 Mar. 23, 2023

(51) Int. Cl.
*H10N 10/17* (2023.01)
*H10N 19/00* (2023.01)

(52) U.S. Cl.
CPC ............. *H10N 10/17* (2023.02); *H10N 19/00* (2023.02)

(58) Field of Classification Search
CPC ......... H01L 23/38; H10N 10/17; H10N 19/00
See application file for complete search history.

(56) References Cited

U.S. PATENT DOCUMENTS

| | | | | |
|---|---|---|---|---|
| 11,664,293 B2 * | 5/2023 | Valavala | ................. | H01L 23/42 |
| | | | | 257/692 |
| 11,694,942 B2 * | 7/2023 | Lofgreen | ............... | H10N 10/01 |
| | | | | 257/712 |
| 2004/0145049 A1 * | 7/2004 | McKinnell | .............. | H01L 23/38 |
| 2008/0137309 A1 * | 6/2008 | Barry | ................. | G05D 23/1931 |
| | | | | 361/720 |
| 2011/0291269 A1 * | 12/2011 | Griebenow | ......... | H01L 25/0652 |
| | | | | 257/737 |
| 2014/0190542 A1 * | 7/2014 | Lane | ...................... | H10N 19/00 |
| | | | | 136/212 |
| 2015/0097207 A1 * | 4/2015 | Chen | ........................ | H01L 23/38 |
| | | | | 257/778 |
| 2019/0122704 A1 * | 4/2019 | Huang | .................... | H01L 23/38 |
| 2021/0125897 A1 * | 4/2021 | Valavala | ............... | H10N 19/00 |

\* cited by examiner

*Primary Examiner* — Devina Pillay
(74) *Attorney, Agent, or Firm* — Arcane Law PLLC

(57) ABSTRACT
Techniques are provided for forming one or more thermo-electric devices integrated within a substrate of an integrated circuit. Backside substrate processing may be used to form adjacent portions of the substrate that are doped with alternating dopant types (e.g., n-type dopants alternating with p-type dopants). The substrate can then be etched to form pillars of the various n-type and p-type portions. Adjacent pillars of opposite dopant type can be electrically connected together via a conductive layer. Additionally, the top portions of adjacent pillars are connected together, and the bottom portions of a next pair of adjacent pillars being coupled together, in a repeating pattern to ensure that current flows through the length of each of the doped pillars. The flow of current through alternating n-type and p-type doped material creates a heat flux that transfers heat from one end of the integrated thermoelectric device to the other end.

16 Claims, 9 Drawing Sheets

100

104

106

110
112
114

108a

108b

102

200

218

214

204

108b

108a

202

208
210

206

108a

212

216

303

305

302

308

312

314     316

303

305

312

500

FORM SEMICONDUCTOR DEVICES ON SUBSTRATE — 502

DOPE BACKSIDE PORTIONS OF SUBTRATE WITH N-TYPE AND P-TYPE DOPANTS — 504

FORM ALTERNATING N-TYPE AND P-TYPE PILLARS AND TAIL SECTIONS FROM THE SUBSTRATE — 506

FORM DIELECTRIC LAYER BETWEEN PILLARS — 508

FORM CONDUCTIVE LAYER TO COUPLE BETWEEN ADJACENT PILLARS — 510

COMPLETE BACKSIDE PROCESSING OF SUBSTRATE — 512

INTEGRATED THERMOELECTRIC DEVICE TO MITIGATE INTEGRATED CIRCUIT HOT SPOTS

FIELD OF THE DISCLOSURE

The present disclosure relates to integrated circuits, and more particularly, to techniques for mitigating heat generated by the integrated circuits.

BACKGROUND

As integrated circuits continue to scale downward in size, a number of challenges arise. For instance, as semiconductor devices become increasingly smaller and more densely packed on a die, a large amount of heat can be locally generated. This heat can have negative effects on the semiconductor device performance and potentially cause damage to the devices. Many techniques have been used to transfer the generated heat away from the integrated circuits, however, such techniques fail to adequately address localized hot spots on the die that may result from certain portions of the integrated circuit being heavily active. Accordingly, there remain a number of non-trivial challenges with respect to heat mitigation within integrated circuits.

Figure 1:
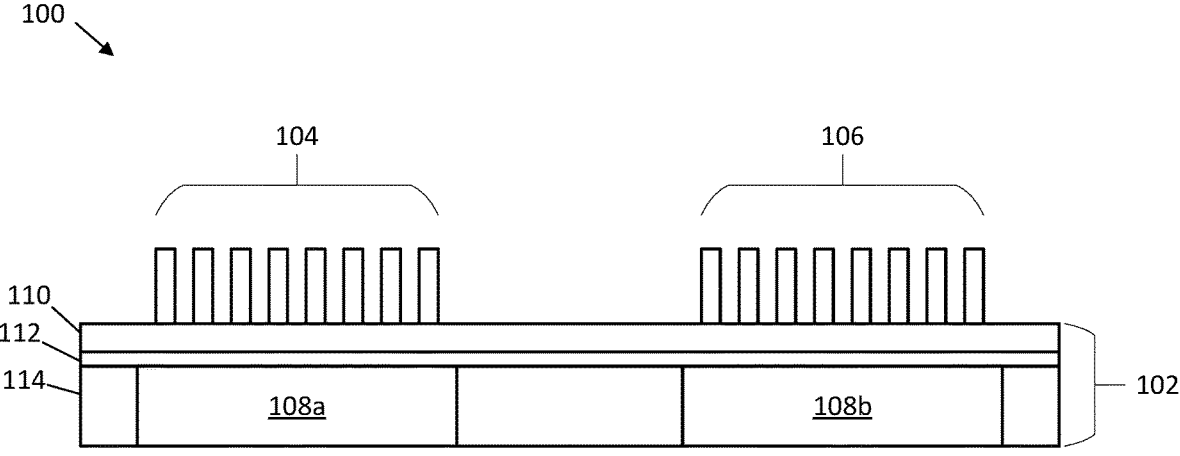
FIG. 1 is a cross-sectional view that illustrates an example portion of an integrated circuit configured with integrated thermoelectric devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein for forming one or more thermoelectric devices integrated within the substrate beneath an integrated circuit. Backside substrate processing may be used to form adjacent portions of the substrate that are doped with alternating dopant types (e.g., n-type dopants alternating with p-type dopants). The substrate can then be etched to form pillars of the various n-type and p-type portions. Adjacent pillars of opposite dopant type can be electrically connected together via a conductive layer. Additionally, the top portions of adjacent pillars are connected together, and the bottom portions of a next pair of adjacent pillars are coupled together. The alternating coupling of pillar pair tops and pillar pair bottoms continues in a repeating pattern to ensure that current flows through the length of each of the doped pillars. The flow of current through alternating n-type and p-type doped material creates a heat flux due to the Peltier effect that transfers heat from one end of the integrated thermoelectric (TE) device to the other end. In this way, such TE devices can be formed within the substrate directly beneath certain portions of an integrated circuit that are known to generate excess heat (e.g., local hot spots) in order to safely transfer the heat away. Numerous variations and embodiments will be apparent in light of this disclosure.

General Overview

As previously noted above, there remain a number of non-trivial challenges with respect to integrated circuit (IC) heat mitigation. In more detail, scaling of standard memory and logic cells can create one or more localized hot spots across the IC. Macro-scale solutions such as Peltier devices, heat sinks, and/or copper heat spreaders provide heat mitigation across an entire die, but are less effective at dealing with localized hot spots on a given die. These local hot spots can, for example, limit the speed in which the transistors can operate and/or cause damage to the devices themselves.

Thus, and in accordance with an embodiment of the present disclosure, techniques are provided herein to fabricate integrated thermoelectric (TE) devices to locally mitigate die hot spots or to provide other IC heat mitigation. Backside substrate processing may be used to form the TE devices within the substrate itself thus placing the TE devices very close to (and in some examples, directly beneath) the heat-producing semiconductor devices. Accordingly, the TE devices may include alternating and electrically coupled n-type and p-type portions of the substrate or of a material deposited onto a backside surface of the substrate. P-type portions of the substrate may be doped with boron while n-type portions of the substrate may be doped with phosphorous or arsenic. Current flows through the alternating n-type and p-type materials in a series connection to draw heat in a direction away from the active semiconductor devices and towards a heat sink or any other type of heat spreader structure. According to some embodiments, the alternating n-type and p-type portions may be etched into n-type or p-type pillars having top surfaces and tail sections. The top surfaces of adjacent pillars can be coupled together and the tail sections of adjacent pillars can be coupled together as will be discussed herein to create a series connection between a plurality of doped pillars. Additionally, any number of doped pillars can be included in any number of different and independently operable TE devices. Thus, according to some embodiments, different TE devices can be activated on an as-needed basis to mitigate the heat from different localized portions of a die.

According to an embodiment, an integrated circuit includes a substrate, a plurality of semiconductor devices on the substrate, and a thermoelectric (TE) device integrated into the substrate beneath the plurality of semiconductor devices. In some examples, the TE device includes first portions of the substrate doped with n-type dopants alternating with second portions of the substrate doped with p-type dopants and a conductive layer coupled between a given first portion of the substrate and an adjacent second portion of the substrate. In some examples, the TE device includes first material portions of bismuth telluride doped with n-type dopants alternating with second material portions of bismuth telluride doped with p-type dopants.

According to another embodiment, an integrated circuit includes a die having a first plurality of semiconductor devices and a second plurality of semiconductor devices, a first thermoelectric device integrated on the die and beneath the first plurality of semiconductor devices, and a second thermoelectric device integrated on the die and beneath the second plurality of semiconductor devices. The first thermoelectric device is independently operable from the second thermoelectric device.

According to another embodiment, an electronic device includes a chip package having one or more dies and a heat sink structure thermally coupled to one side of the chip package. At least one of the one or more dies includes a substrate, a plurality of semiconductor devices on the substrate, and a thermoelectric (TE) device integrated into the substrate beneath the plurality of semiconductor devices. The TE device is between the plurality of semiconductor devices and the heat sink structure. In some examples, the TE device includes first portions of the substrate doped with n-type dopants alternating with second portions of the substrate doped with p-type dopants and a conductive layer coupled between a given first portion of the substrate and an adjacent second portion of the substrate. In some examples, the TE device includes first material portions of bismuth telluride doped with n-type dopants alternating with second material portions of bismuth telluride doped with p-type dopants.

According to another embodiment, a method of forming an integrated circuit includes forming a plurality of semiconductor devices on a substrate; doping a first plurality of portions of the substrate with n-type dopants, the first plurality of portions of the substrate being beneath the plurality of semiconductor devices; doping a second plurality of portions of the substrate with p-type dopants, the second plurality of portions of the substrate being beneath the plurality of semiconductor devices and alternating with the first plurality of portions of the substrate; forming alternating pillars of the first plurality of portions of the substrate and the second plurality of portions of the substrate; forming a dielectric layer between the alternating pillars of the first plurality of portions of the substrate and the second plurality of portions of the substrate; and forming a conductive layer coupled between one of the pillars of the first plurality of portions of the substrate and an adjacent pillar of the second plurality of portions of the substrate.

The techniques can be used with any type of planar and non-planar transistors, including finFETs (sometimes called double-gate transistors, or tri-gate transistors), nanowire and nanoribbon transistors (sometimes called gate-all-around transistors), and thin film transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of TE structures integrated into the substrate. Such TE structures may include alternatingly doped portions of the substrate that are coupled together in a series arrangement. In some other examples, the TE structures may include alternatingly doped portions of another material that is different from the substrate material and has been deposited onto a backside portion of the substrate.

As used herein, the term "backside" generally refers to the area beneath one or more semiconductor devices (below the device layer) either within the device substrate or in the region of the device substrate (in the case where the bulk of the device substrate has been removed). Similarly, as used herein, the term "frontside" generally refers to the area above the one or more semiconductor devices (above the device layer) and includes an interconnect region having one or more interconnect layers with metal structures for carrying signal or power voltages. Note that the backside may become the frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1 is a cross-sectional view that illustrates an example portion of an integrated circuit 100. Integrated circuit 100 includes a substrate 102 along with at least a first plurality of semiconductor devices 104 and a second plurality of semiconductor devices 106. According to some embodiments, substrate 102 includes one or more integrated TE devices, such as TE device 108a and TE device 108b. The cross-section may be taken through the semiconductor devices away from the source or drain regions (not visible in this cross-section). The semiconductor devices in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other devices that generate heat).

According to some embodiments, first plurality of semiconductor devices 104 may be physically separated by some distance from second plurality of semiconductor devices 106 on the same die. In some examples, first plurality of semiconductor devices 104 and second plurality of semiconductor devices are adjacent to each other on the die.

A corresponding TE device may be integrated beneath a given plurality of semiconductor devices. In the illustrated example, a first TE device 108a is integrated within substrate 102 beneath first plurality of semiconductor devices 104 and a second TE device 108b is integrated within substrate 102 beneath second plurality of semiconductor devices 106. Each of first plurality of semiconductor devices 104 and second plurality of semiconductor devices 106 may represent a circuit designed for a particular function, such as a clock circuit or an adder circuit, to name a few examples.

In the illustrated embodiment, substrate 102 is a semiconductor-on-insulator (SOI) substrate having a desired semiconductor device layer 110 over a buried insulator layer 112 (e.g., silicon over silicon dioxide) and a bulk portion 114 beneath buried insulator layer 112. Bulk portion 114 may be the same semiconductor material as device layer 110 (e.g., silicon). In some other embodiments, substrate 102 is a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a multilayer substrate or superlattice suitable for forming nanowires or nanoribbons (e.g., alternating layers of silicon and SiGe, or alternating layers indium gallium arsenide and indium phosphide). The embodiments discussed herein include TE devices integrated into the backside of an SOI substrate, however, similar processes may be used to also form such TE devices into the other types of substrates mentioned above.

First TE device 108a may be any size to adequately draw heat from first plurality of semiconductor devices 104. Similarly, second TE device 108b may be any size to adequately draw heat from second plurality of semiconductor devices 106. Furthermore, first TE device may be independently operable from second TE device to allow for on-demand hot spot mitigation from either or both of first plurality of semiconductor devices 104 and second plurality of semiconductor devices 106 at any given time. The specific details of the structure of TE devices 108a and 108b are provided herein as part of the fabrication process illustrated in FIGS. 3A-3J.

Figure 2:
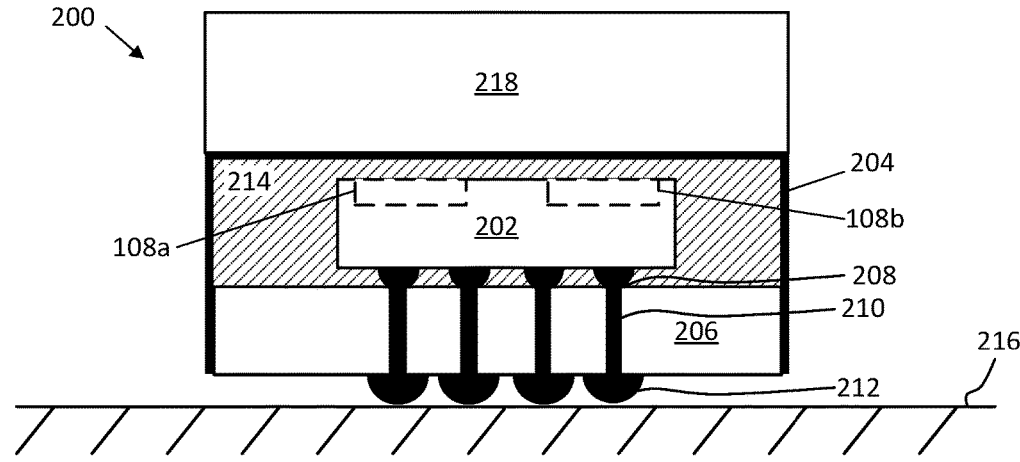
FIG. 2 illustrates a cross-section view of a chip package containing one or more semiconductor dies having one or more thermoelectric devices, in accordance with some embodiments of the present disclosure.

FIG. 2 illustrates an example embodiment of a chip package 200, in accordance with an embodiment of the present disclosure. As can be seen, chip package 200 includes a die 202. In some examples die 202 represents any number of dies included within chip package 200 (e.g. a system-in-package). Die 202 may include at least one integrated circuit having a structure as described above in FIG. 1. Accordingly, a given die 202 may include integrated TE devices 108a and 108b. Die 202 may include any other circuitry used to interface with other devices formed on the dies, or other devices connected to chip package 200, in some example configurations.

As can be further seen, chip package 200 includes a housing 204 that is bonded to a package substrate 206. The housing 204 may be any standard or proprietary housing, and may provide, for example, electromagnetic shielding and environmental protection for the components of chip package 200. The die 202 may be conductively coupled to package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board (PCB) 216. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via, or an interconnect structure that meanders through the thickness of substrate 206 to contact one or more intermediate locations therein). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around die 202 included within housing 204 (e.g., between die 202 and package substrate 206 as an underfill material, as well as between die 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive, in addition to being electrically insulating. In some embodiments, mold material 214 acts as a thermal interface material (TIM) between die 202 and a heat sink 218. According to some embodiments, the top of housing 204 may include a conductive metal material, such as copper, or include one or more metal metals to act as a head spreader in conjunction with mold material 214 to assist in the transfer of heat between die 202 and heat sink 218. In some examples, heat sink 218 includes a fin array structure.

According to some embodiments, either or both TE devices 108*a* and 108*b* independently operate to transfer heat from devices on die 202 towards heat sink 218. Accordingly, due to the Peltier effect, the current flow through a given TE device draws heat upwards away from the semiconductor devices on die 202 and through mold material 214 and the top of housing 204 so that it can be dissipated at heat sink 218.

Fabrication Methodology

FIGS. 3A-3J are cross-sectional views that collectively illustrate an example process for forming an integrated TE device beneath a plurality of semiconductor devices, in accordance with an embodiment of the present disclosure. Each figure shows an example structure that results from the process flow up to that point in time, so the depicted structure evolves as the process flow continues. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 3A:
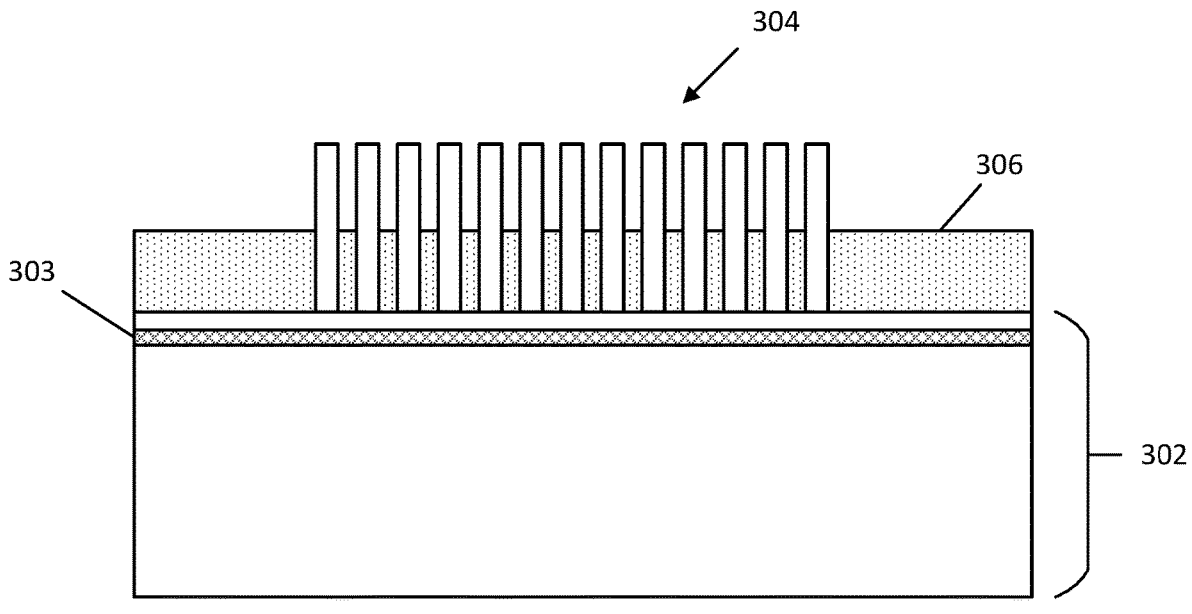
FIGS. 3A-3J are cross-sectional views that collectively illustrate an example process for forming thermoelectric devices integrated into a substrate, in accordance with an embodiment of the present disclosure.

FIG. 3A is a cross sectional view taken through a substrate 302 having a plurality of semiconductor devices 304 formed on or over substrate 302, according to some embodiments. According to some embodiments, substrate 302 is an SOI substrate having a buried insulator layer 303 similar to substrate 102 discussed above with reference to FIG. 1. Accordingly, the device layers and bulk portion of substrate 302 may be silicon and buried insulator layer 303 may be silicon oxide.

Any number of semiconductor devices 304 may be included. Semiconductor devices 304 may be finFET devices having one or more fins of active semiconductor material that extend between a source and drain region, or GAA devices that include semiconductor nanoribbons or nanowires that extend between a source and drain region. The fins or nanowires/nanoribbons of the semiconductor devices 304 can be, for example, native to the substrate (formed from the substrate itself), such as silicon fins etched from the top device layer of substrate 302. Alternatively, the fins or nanowires/nanoribbons can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the nanowires and nanoribbons during a gate forming process where one type of the alternating layers are selectively etched away so as to liberate the other type of alternating layers within the channel region, so that the gate-all-around (GAA) process can then be carried out. Again, the alternating layers can be blanket deposited and then etched into fins, or deposited into fin-shaped trenches. Other embodiments may use planar transistor architecture, such that there are no fins, nanowires, or nanoribbons.

Although not shown in this cross-section, semiconductor devices 304 include source or drain regions, which can be epitaxial source or drain regions that are provided on the fins in an etch-and-replace process. In other embodiments one or both of the source or drain regions could be, for example, implantation-doped native portions of the fins or substrate 302. Any semiconductor materials suitable for source and drain regions can be used (e.g., group IV and group III-V semiconductor materials). The source and drain regions may include multiple layers such as liners and capping layers to improve contact resistance. In any such cases, the composition and doping of source or drain regions may be the same or different, depending on the polarity of the transistors. Any number of source and drain configurations and materials can be used.

According to some embodiments, the fins of the semiconductor devices 304 extend above a dielectric layer 306 that acts as an STI layer between the semiconductor devices 304. Dielectric layer 306 can be any suitable dielectric material, such as silicon dioxide, silicon nitride, silicon oxynitride, or silicon oxycarbonitride.

Figure 3B:
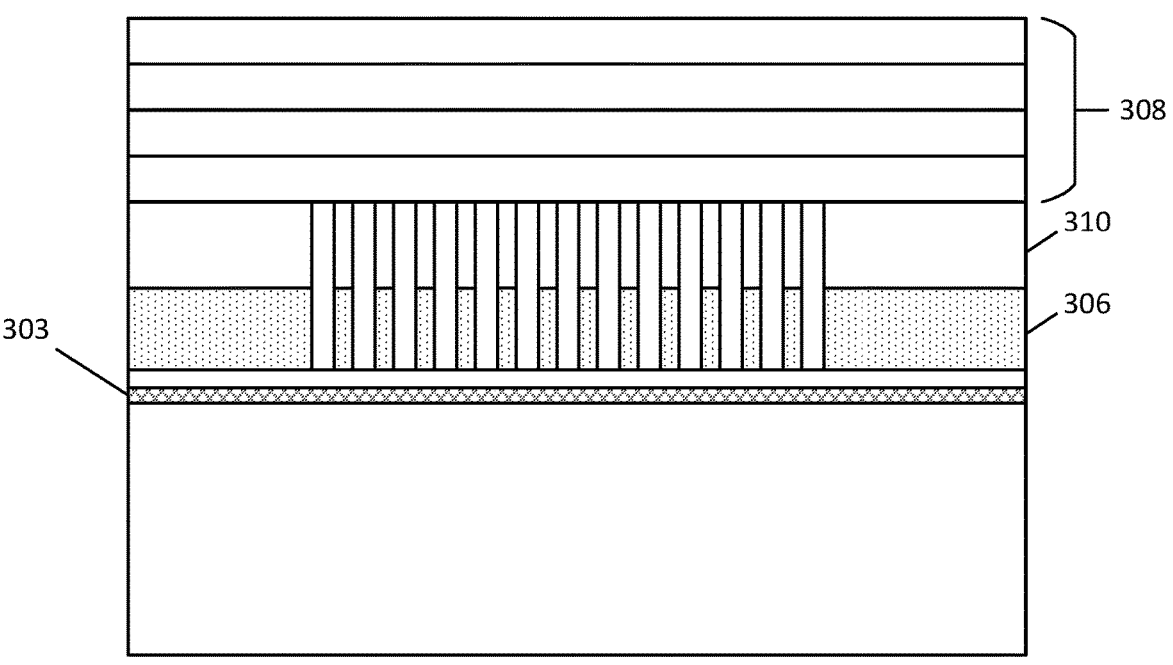

FIG. 3B is the cross-sectional view of the structure depicted in FIG. 3A, after formation of an interconnect region 308 above the semiconductor devices, according to an embodiment of the present disclosure. Furthermore, another material layer 310 may be formed around active portions of semiconductor devices 304 and can be an interlayer dielectric or a gate layer. Accordingly, material layer 310 may be deposited using any conventional deposition technique, such as chemical vapor deposition (CVD), plasma-enhanced chemical vapor deposition (PECVD), flowable CVD, spin-on dielectric, or atomic layer deposition (ALD).

Interconnect region 308 may include any number of stacked interconnect layers. Each of the stacked interconnect layers includes a dielectric material deposited using any conventional deposition technique, such as CVD, PECVD, flowable CVD, spin-on dielectric, or ALD. Furthermore, each layer may include one or more conductive features such as conductive traces and/or conductive vias, to from electrical interconnects carrying power and/or signal voltages to the various semiconductor devices 304. One or more of the conductive features in any of the interconnect layers may be electrically coupled with a conductive via or deep via boundary (DVB) structure that extends through at least the device layer and buried insulator layer 303 of substrate 302 to connect with one or more conductive backside features.

Figure 3C:
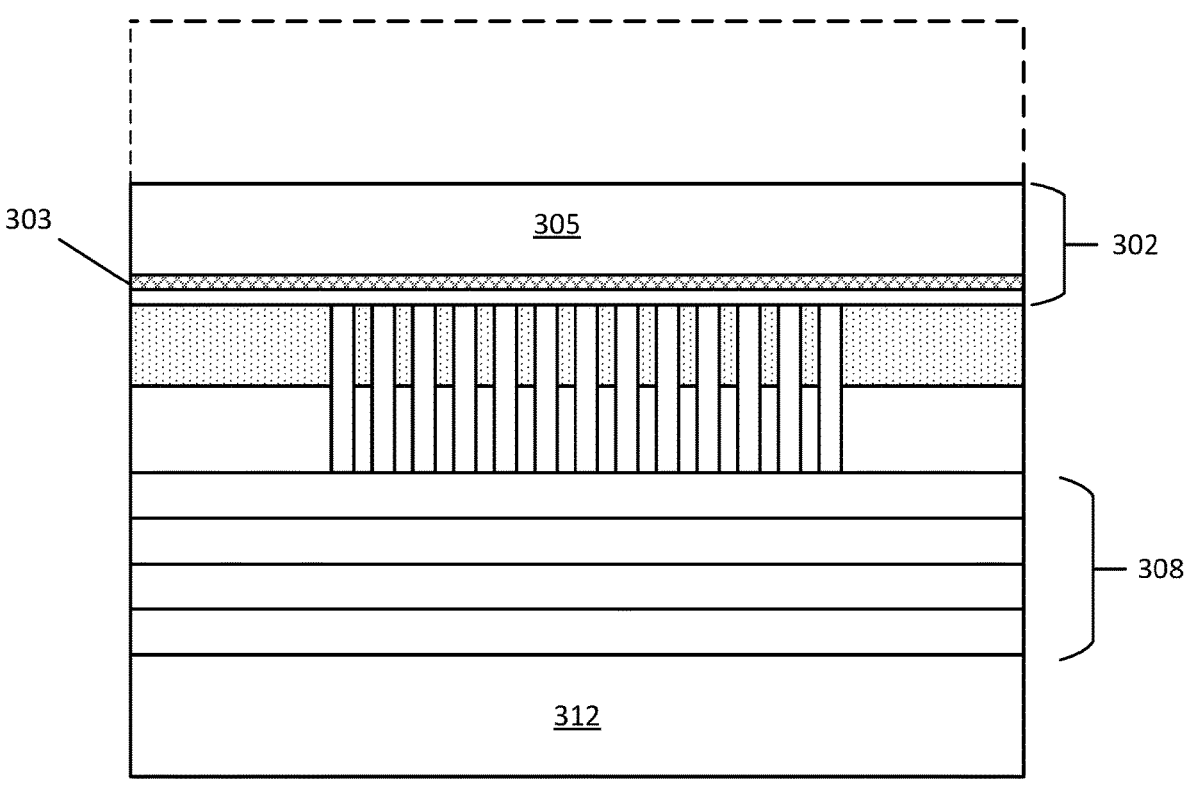

FIG. 3C is the cross-sectional view of the structure depicted in FIG. 3B, after bonding a carrier substrate 312 to interconnect region 308 and removing a portion of substrate 302, according to an embodiment of the present disclosure. The structure from FIG. 2B has been flipped over to more easily illustrate the remaining backside processes used to form the TE devices.

According to some embodiments, carrier substrate 312 may be any bulk semiconductor or glass substrate. In some examples, carrier substrate 312 includes silicon, germanium, or borosilicate glass. Carrier substrate 312 may be similar to substrate 102 and the above discussion regarding the possible forms of substrate 102 also apply to carrier substrate 312. Carrier substrate 312 may be bonded to interconnect region 308 using a hybrid bonding process involving the application of both pressure and high temperatures between about 200 C and about 450 C. According to some embodiments, carrier substrate 312 may include a dielectric layer on its top surface that bonds with the dielectric material of the interconnect layer in interconnect region 308 during a thermal bonding process. In some examples, metal features between carrier substrate 312 and the interconnect layer may undergo a metal-metal bonding where an application of heat causes the metals to reflow and form a bond. Other known bonding techniques may be used as well as would be apparent to one skilled in the relevant art.

According to some embodiments, the bulk portion of substrate 302 is thinned by removing a given thickness of the bulk portion (identified by dashed lines). According to some embodiments, a thickness of the bulk portion of substrate 302 is removed using, for example, chemical mechanical polishing (CMP) until only a certain bulk thickness remains above buried dielectric layer 303. Other removal processes may involve any dry plasma-based etches or wet etchants to remove the semiconductor material.

In some embodiments, a remaining backside substrate portion 305 is left as part of substrate 302 following the removal of the other bulk portion. In this way, a portion of substrate 302 is used to form the integrated TE devices. For example, backside substrate portion 305 may be silicon such that the TE devices are formed using doped silicon regions of backside substrate portion 305 as illustrated in the remaining FIGS. 3D-3J. However, in some other embodiments, all of the bulk portion of substrate 302 is removed up until buried insulator layer 303. Afterwards, another material is deposited over buried insulator layer 303 and used to form the TE devices. For example, backside substrate portion 305 may be removed and replaced with a layer of bismuth telluride ($Bi_2Te_3$). TE devices may then be formed in the deposited layer of bismuth telluride using the same procedure illustrated in the remaining FIGS. 3D-3J (where backside substrate portion 305 is instead a layer of bismuth telluride). Other materials may be deposited over buried insulator layer 303 and used as a basis to form the TE devices, such as cupronickel (CuNi) or palladium silver (PdAg). When using any of $Bi_2Te_3$, CuNi, or PdAg, the doping procedure illustrated in FIG. 3D may not be performed.

Figure 3D:
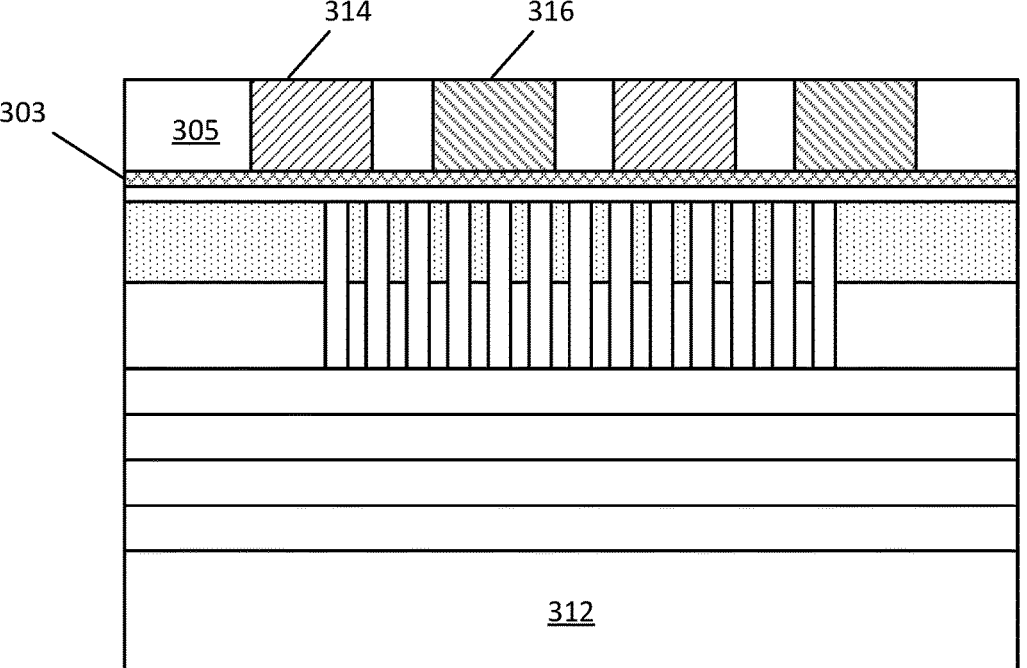

FIG. 3D is the cross-sectional view of the structure depicted in FIG. 3C, after doping various regions of backside substrate portion 305, according to an embodiment of the present disclosure. According to some embodiments, a plurality of n-type regions 314 may be formed alternating with a plurality of p-type regions 316 across at least a portion of backside substrate portion 305. The alternating n-type and p-type regions may be generally formed beneath semiconductor devices 304. It should be understood that FIG. 3D is not drawn to scale such that there can be many more alternating n-type and p-type regions beneath a given plurality of semiconductor devices, but four are illustrated here for clarity.

According to some embodiments, n-type regions 314 are doped with either phosphorous or arsenic at a dopant concentration between $1\times10^{17}$ cm$^{-3}$ and $1\times10^{21}$ cm$^{-3}$. Similarly, p-type regions 316 may be doped with boron at a dopant concentration between $1\times10^{17}$ cm$^{-3}$ and $1\times10^{21}$ cm$^{-3}$. Different dopants and/or dopant concentrations may be used for different material compositions of backside substrate portion 305. The depth of the doped regions 314 and 316 may extend throughout the entire thickness of backside substrate portion 305 (as illustrated). However, in some embodiments, the doped regions 314 and 316 extend only through a portion of the thickness of backside substrate portion 305. In some examples, backside substrate portion 305 has a total thickness between about 10 nm and about 1000 nm. The distance between a given adjacent pair of n-type region 314 and p-type region 316 may vary depending on the desired density of the pillar structures in the TE device and the amount of expected heat to be mitigated. In some examples, the distance between a given adjacent pair of n-type region 314 and p-type region 316 is between about 10 nm and about 100 nm.

Figure 3E:
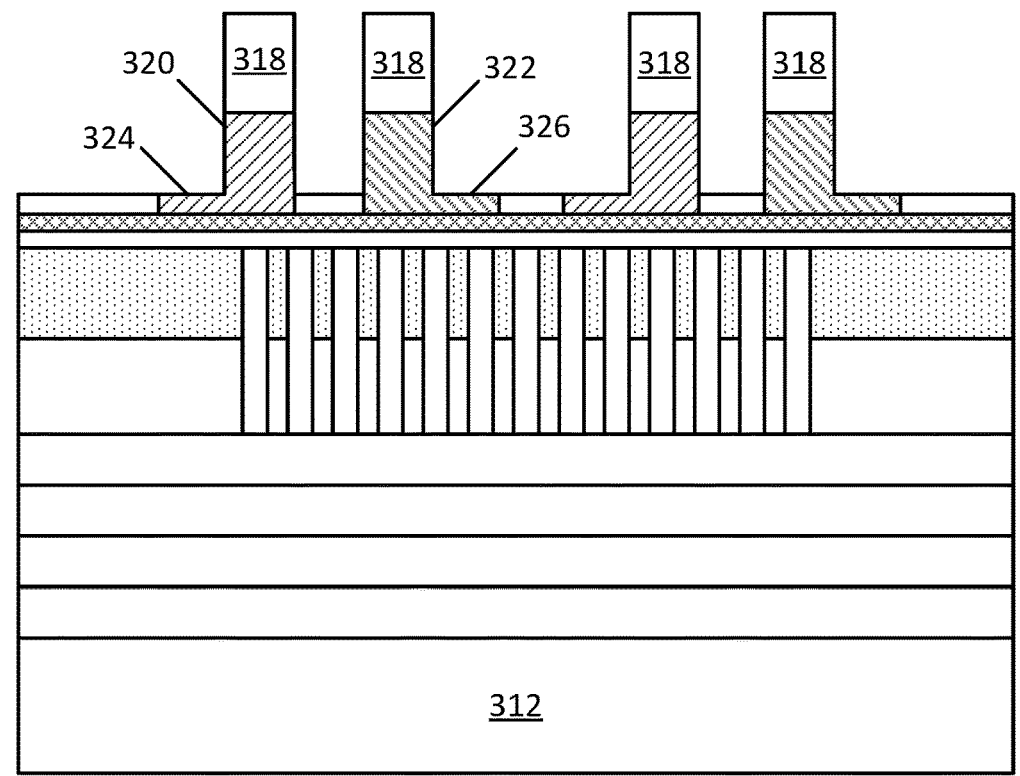

FIG. 3E is the cross-sectional view of the structure depicted in FIG. 3D, after forming TE pillar structures from the doped regions, according to an embodiment of the present disclosure. A masking layer 318 is deposited and lithographically patterned over backside substrate portion 305 to protect one or more regions of backside substrate portion 305 during an anisotropic etching process, such as a reactive ion etching (RIE) process or deep reactive ion etching (DRIE) process. Masking layer 318 may be a photoresist or a hard mask, such as a carbon hard mask (CHE).

Following the etching process, alternating n-type pillars 320 and p-type pillars 322 are formed, according to an embodiment. Each of n-type pillars 320 and p-type pillars 322 may have a height between about 30 nm and about 500 nm and a width between about 5 nm and about 50 nm. Note that although FIG. 3E illustrates inconsistent distances between adjacent pillars, this scaling is just one example and the distances between all adjacent pillars may be substantially the same (e.g., within 2 nm). In one example, the distance between any adjacent pair of n-type pillar 320 and p-type pillar 322 is between about 10 and about 100 nm.

According to some embodiments, the etching process does not etch through an entire thickness of the doped regions, such that each of the doped regions includes a tail section. In the illustrated example, the doped n-type regions include both n-type pillars 320 and n-type tails 324 while the doped p-type regions include both p-type pillars 322 and p-type tails 326. As will be made clearer in the proceeding Figures, the tail sections allow for electrical connections to be made between adjacently-facing tail sections. In this way, electrical connections can be made across the tops of adjacent pillars and across adjacent tail sections to form a series connection across any number of alternately doped regions. In some examples, tail sections 324 and 326 have a thickness between about 5 nm and about 20 nm.

Figure 3F:
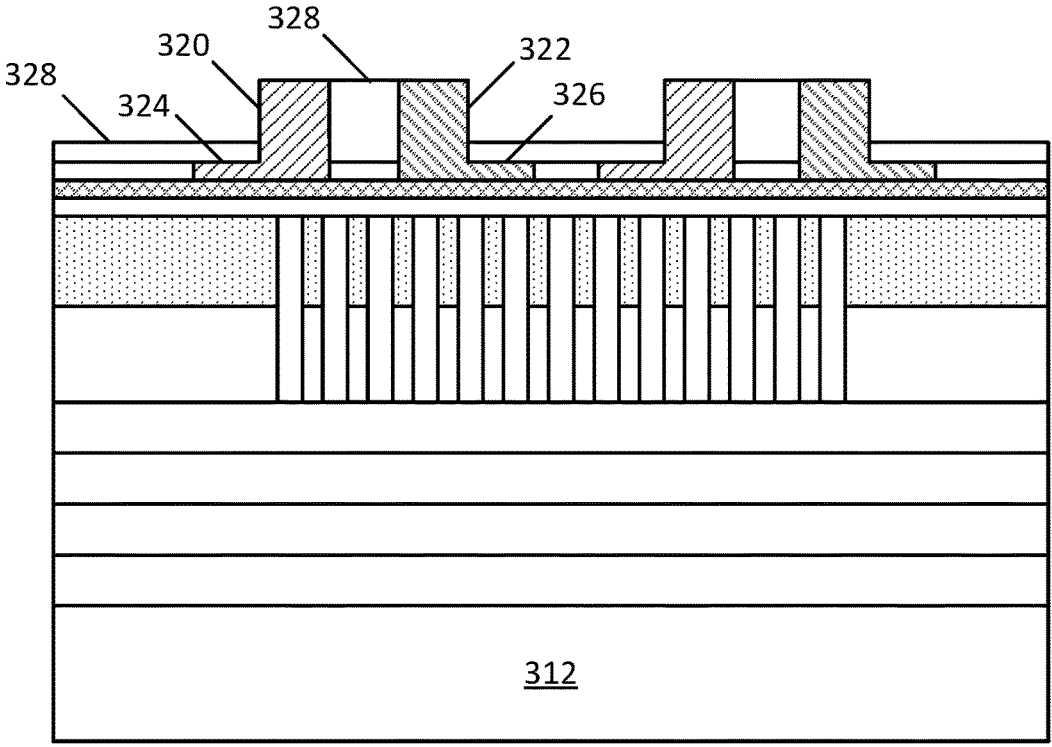

FIG. 3F is the cross-sectional view of the structure depicted in FIG. 3E, after forming a dielectric layer 328 between adjacent pillars, according to an embodiment of the present disclosure. Dielectric layer 328 may be any suitable dielectric material such as silicon oxide, silicon nitride, silicon oxynitride, or silicon oxycarbonitride deposited using any of CVD, PECVD, flowable CVD, spin-on dielectric, or ALD. According to some embodiments, dielectric layer 328 is first deposited to a height above the top surfaces of n-type pillars 320 and p-type pillars 322 and subsequently polished back using, for example, CMP to be planarized with the top surfaces of the pillars. Afterwards, the portions of dielectric layer 328 over the tail sections 324 and 326 are recessed using any known wet or dry isotropic etching process to a final thickness between about 5 nm and about 20 nm.

Figure 3G:
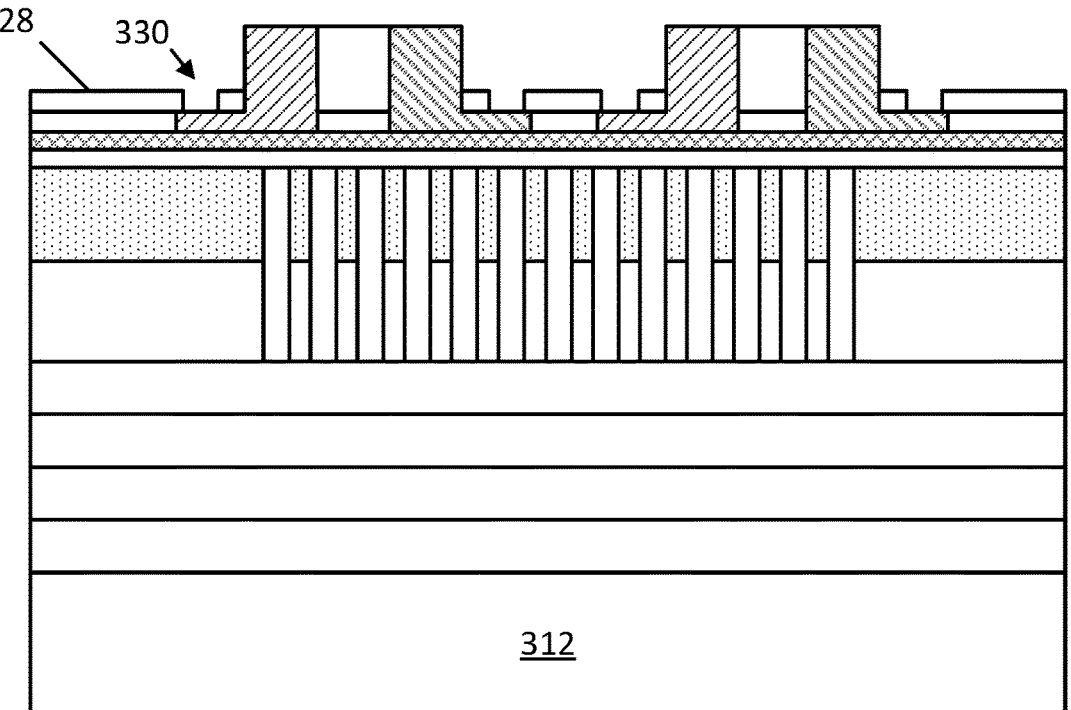

FIG. 3G is the cross-sectional view of the structure depicted in FIG. 3F, after forming openings 330 through dielectric layer 328 over each of the tail sections, according to an embodiment of the present disclosure. Openings 330 may be formed via standard lithographic processes to mask other portions of dielectric layer 328 and etch through the exposed portions. In some embodiments, an anisotropic etching process, such as RIE, is used to form openings 330 through dielectric layer 328.

Figure 3H:
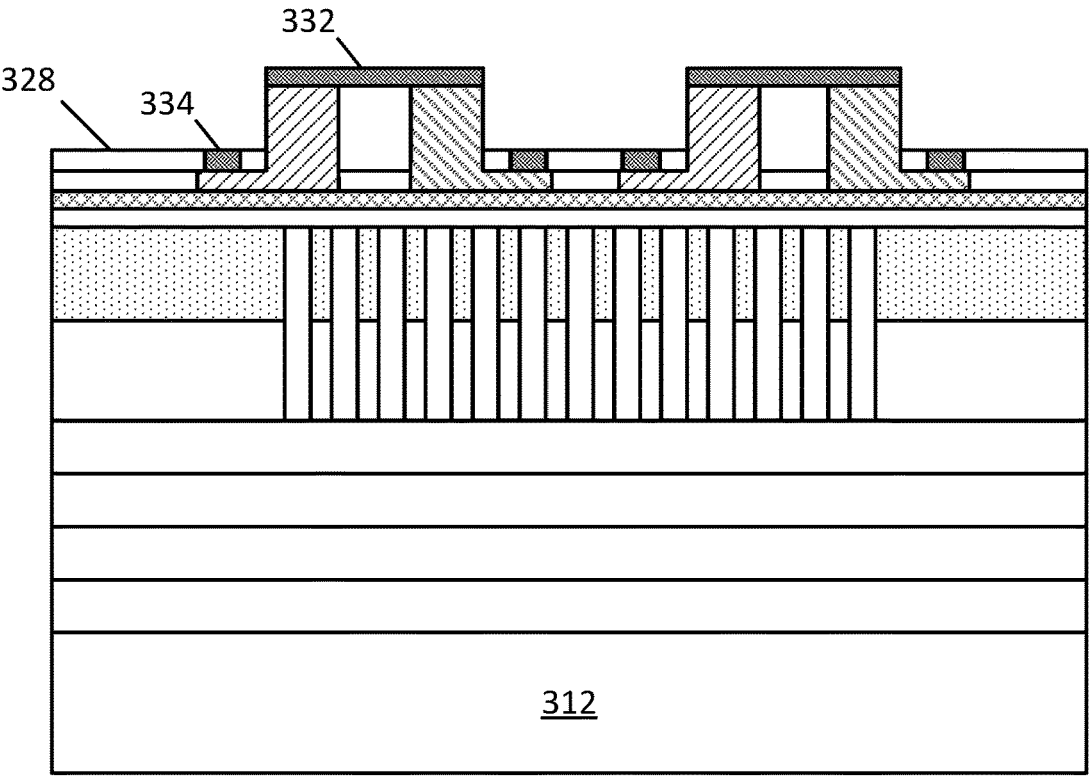

FIG. 3H is the cross-sectional view of the structure depicted in FIG. 3G, after forming conductive layers across the tops of adjacent pillars and within the openings 330, according to an embodiment of the present disclosure. First conductive layers 332 may be formed across the top surfaces of adjacent pillars to conductively connect the adjacent pillars via corresponding first conductive layers 332. In some example, first conductive layers 332 include tungsten although other metals or metal alloys may be used as well. First conductive layers 332 may be deposited using any of CVD, PECVD, physical vapor deposition (PVD), or ALD.

According to some embodiments, second conductive layers 334 are formed within openings 330 to contact the tail regions. Second conductive layers 334 may be the same material as first conductive layers 332. In some embodiments, second conductive layers 334 are deposited along with first conductive layers 332 in the same process.

Figure 3I:
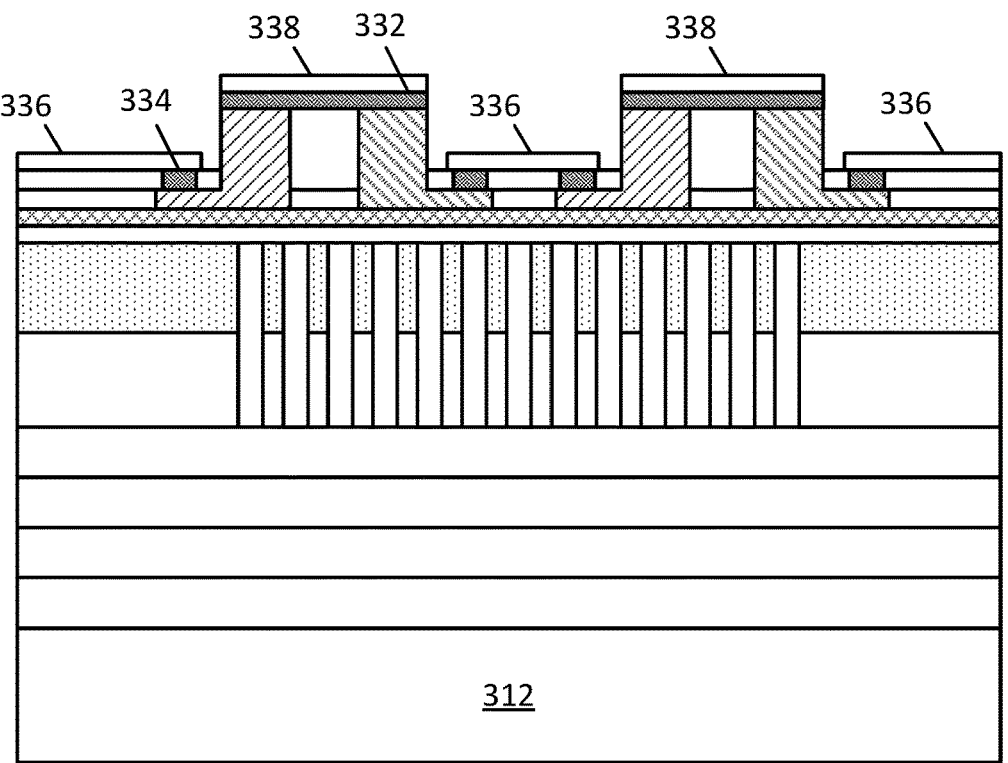

FIG. 3I is the cross-sectional view of the structure depicted in FIG. 3H, after forming additional conductive layers across the tops of adjacent pillars and to connect between adjacent tail sections, according to an embodiment of the present disclosure. Third conductive layers 336 are formed over portions of second conductive layer 334 to provide electrical connection between adjacent tail sections. In some embodiments, third conductive layers 336 include copper, although other metals or metal alloys may be used as well. Third conductive layers 336 may be deposited using any of CVD, PECVD, PVD, or ALD.

Fourth conductive layers 338 may be deposited over the top of first conductive layers 332, according to some embodiments. Fourth conductive layers 338 may act as heat spreader layers and thus may include a material having a relatively high coefficient of thermal expansion (CTE). In one example, fourth conductive layers 338 include copper, although other metals or metal alloys may be used as well. In some embodiments, fourth conductive layers 338 are deposited along with third conductive layers 336 in the same process.

Figure 3J:
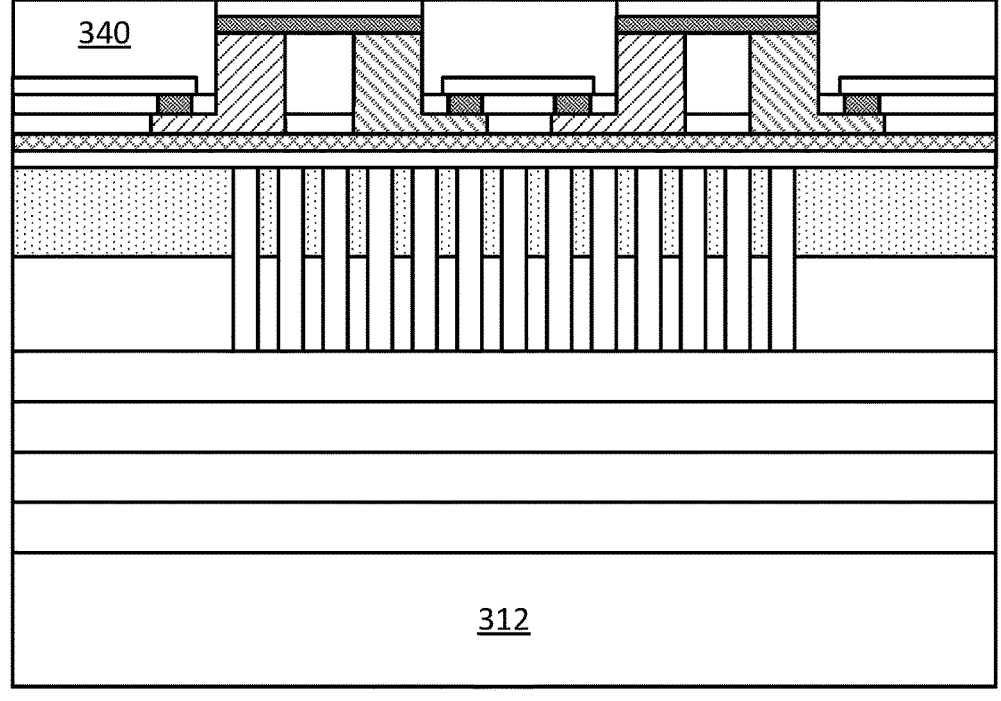

FIG. 3J is the cross-sectional view of the structure depicted in FIG. 3I, after forming a dielectric fill 340, according to an embodiment of the present disclosure. Dielectric fill 340 may be used to protect the various TE structures and to provide a planarized top surface above the TE structures. According to some embodiments, dielectric fill 340 may be any suitable dielectric material such as silicon oxide, silicon nitride, silicon oxynitride, or silicon oxycarbonitride deposited using any of CVD, PECVD, flowable CVD, spin-on dielectric, or ALD. According to some embodiments, dielectric fill 340 is first deposited to a height above the top surfaces of fourth conductive layers 338 and subsequently polished back using, for example, CMP to be planarized with the top surfaces of fourth conductive layers 338.

The TE device illustrated in FIG. 3J includes an array of doped substrate portions connected in a series arrangement, according to some embodiments. Applying a voltage across the array of doped substrate portions will draw heat away from the semiconductor devices and towards a heat sink structure (not shown) thermally coupled over the TE device, such that the TE device is between the heat sink structure and the semiconductor devices. Also, connecting each pillar at its bottom end and top end ensures that the current flows through a length (e.g., vertical height) of each of the pillars.

Figure 4:
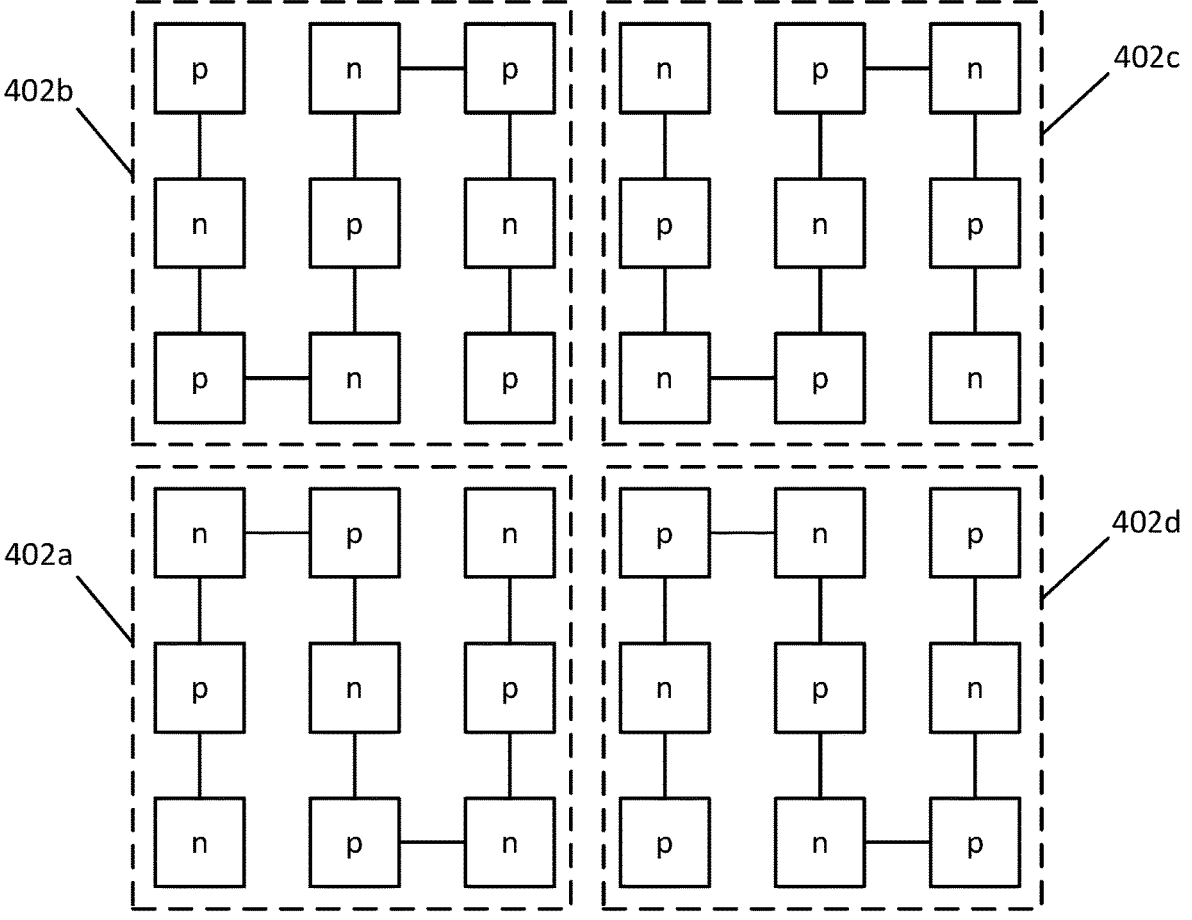
FIG. 4 is a plan view that illustrates an example coupling scheme between doped regions to form separate thermoelectric devices, in accordance with an embodiment of the present disclosure.

FIG. 4 illustrates a plan view of an arrangement of different doped n-type and p-type pillars, according to an embodiment. By electrically connecting different patterns of pillars together, a plurality of independently operable TE devices can be created. For example, the illustrated embodiment shows four separate TE devices 402a-402d. Each TE device includes a given number of connected pillars in a series arrangement. By applying voltage across the pillars of a given TE device, heat can be mitigated over the region above the given TE device, allowing for more focused hot-spot heat mitigation. Although each of TE devices 402a-402d is illustrated as having the same number of doped n-type and p-type pillars, this is only for illustrative purposes and each TE device can have any number of doped n-type and p-type pillars in any physical arrangement.

Methodology

Figure 5:
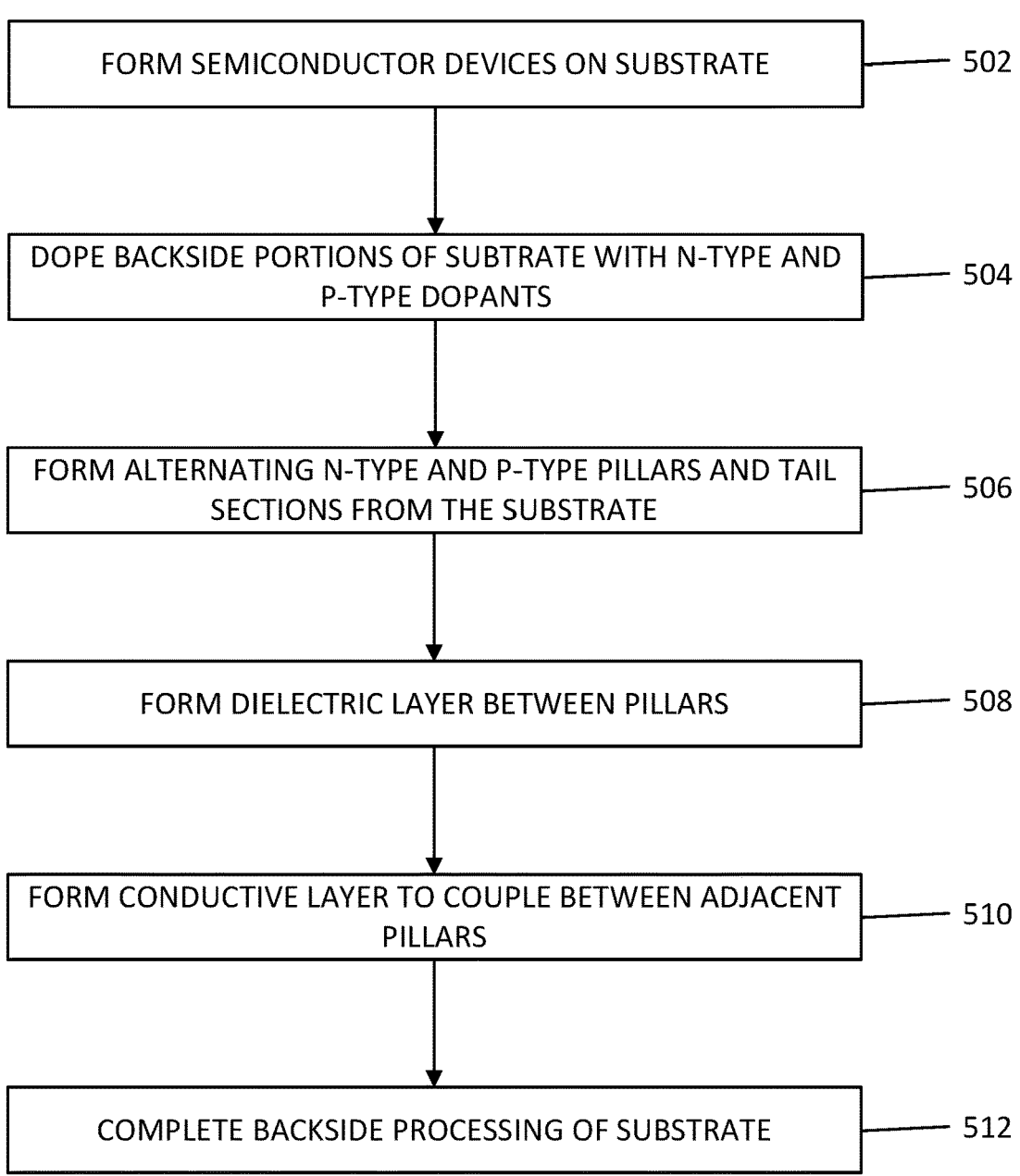
FIG. 5 is a flowchart of a fabrication process for an integrated circuit including one or more integrated thermoelectric devices, in accordance with an embodiment of the present disclosure.

FIG. 5 is a flow chart of a method 500 for forming one or more integrated TE devices, according to an embodiment. Various operations of method 500 may be illustrated in FIGS. 3A-3J. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe many steps that are performed to form common transistor structures. Some of the operations of method 500 may be performed in a different order than the illustrated order.

Method 500 begins with operation 502 where semiconductor devices are formed on a substrate. The semiconductor devices may include finFET devices having one or more fins of active semiconductor material that extend between a source and drain region, or GAA devices that include semiconductor nanoribbons or nanowires that extend between a source and drain region, thin film transistors (TFTs), or planar MOSFETs. Any known fabrication process may be used to form any of the semiconductor devices.

Method 500 continues with operation 504 where backside portions of the substrate are doped with n-type and p-type dopants. The bulk portion of the substrate may be thinned from its backside to produce a remaining backside substrate portion having a height between about 50 nm and about 1000 nm. Distinct regions of the backside substrate portion may then be doped in an alternating fashion of n-type and p-type dopants separate by some distance from one another. The alternating n-type and p-type regions may be generally formed beneath the semiconductor devices.

According to some embodiments, the n-type regions are doped with either phosphorous or arsenic at a dopant concentration between $1 \times 10^{17}$ cm$^{-3}$ and $1 \times 10^{21}$ cm$^{-3}$. Similarly, the p-type regions may be doped with boron at a dopant concentration between $1 \times 10^{17}$ cm$^{-3}$ and $1 \times 10^{21}$ cm$^{-3}$. Different dopants and/or dopant concentrations may be used for different material compositions of the backside substrate portion. The depth of the various doped regions may extend throughout the entire thickness of the backside substrate portion.

Method 500 continues with operation 506 where alternating n-type and p-type pillars and tail sections are formed from the alternating n-type and p-type regions. Each of the n-type pillars and p-type pillars may have a height between about 30 nm and about 500 nm and a width between about 5 nm and about 50 nm. In one example, the distance between any adjacent pair of n-type pillar and p-type pillar is between about 10 and about 100 nm. The pillars may be formed using an anisotropic etching process such as RIE or DRIE.

According to some embodiments, the etching process does not etch through an entire thickness of the doped regions, such that each of the doped n-type and p-type regions includes a tail section. A tail section may be thin (compared to its corresponding pillar) doped portion that extends away from that pillar that it is attached to. Accordingly, doped n-type regions include both n-type pillars and corresponding n-type tail sections while the doped p-type regions include both p-type pillars and corresponding p-type tails sections. The tail sections allow for electrical connections to be made across both the tops of adjacent pillars and across adjacent tail sections to form a series connection across any number of alternately doped regions. In some examples, the tail sections have a thickness between about 5 nm and about 20 nm.

Method 500 continues with operation 508 where a dielectric layer is formed between each of the alternately doped pillars. The dielectric layer may be any suitable dielectric material such as silicon oxide, silicon nitride, silicon oxynitride, or silicon oxycarbonitride deposited using any of CVD, PECVD, flowable CVD, spin-on dielectric, or ALD. According to some embodiments, the dielectric layer is first deposited to a height above the top surfaces of the n-type pillars and p-type pillars and subsequently polished back using, for example, CMP to be planarized with the top surfaces of the pillars. Afterwards, the portions of the dielectric layer over the tail sections are recessed using any known wet or dry isotropic etching process to a final thickness between about 5 nm and about 20 nm.

Method 500 continues with operation 510 where conductive layers are formed between adjacent pillars to form a series connection between the pillars. According to some embodiments, conductive layers may be formed over the top surfaces of adjacent pillars and over adjacent tail sections to continually link together a string of alternating n-type and p-type regions. The conductive layers may include one or more layers of metal, such as layers of copper and/or tungsten to provide an electrical contact between adjacent doped regions. The conductive layers may be deposited using any of CVD, PECVD, PVD, or ALD.

Method 500 continues with operation 512 where backside processing of the substrate is completed. According to some embodiments, additional backside processes may include forming backside interconnect layers as part of a backside interconnect region similar to interconnect region 308 discussed above with reference to FIG. 3B. Additionally, one or more through-silicon vias (TSV) may be formed to make electrical connection with one or more of the conductive features in any of the interconnect layers of interconnect region 308 or with any of the semiconductor devices from the backside of the structure.

Example System

Figure 6:
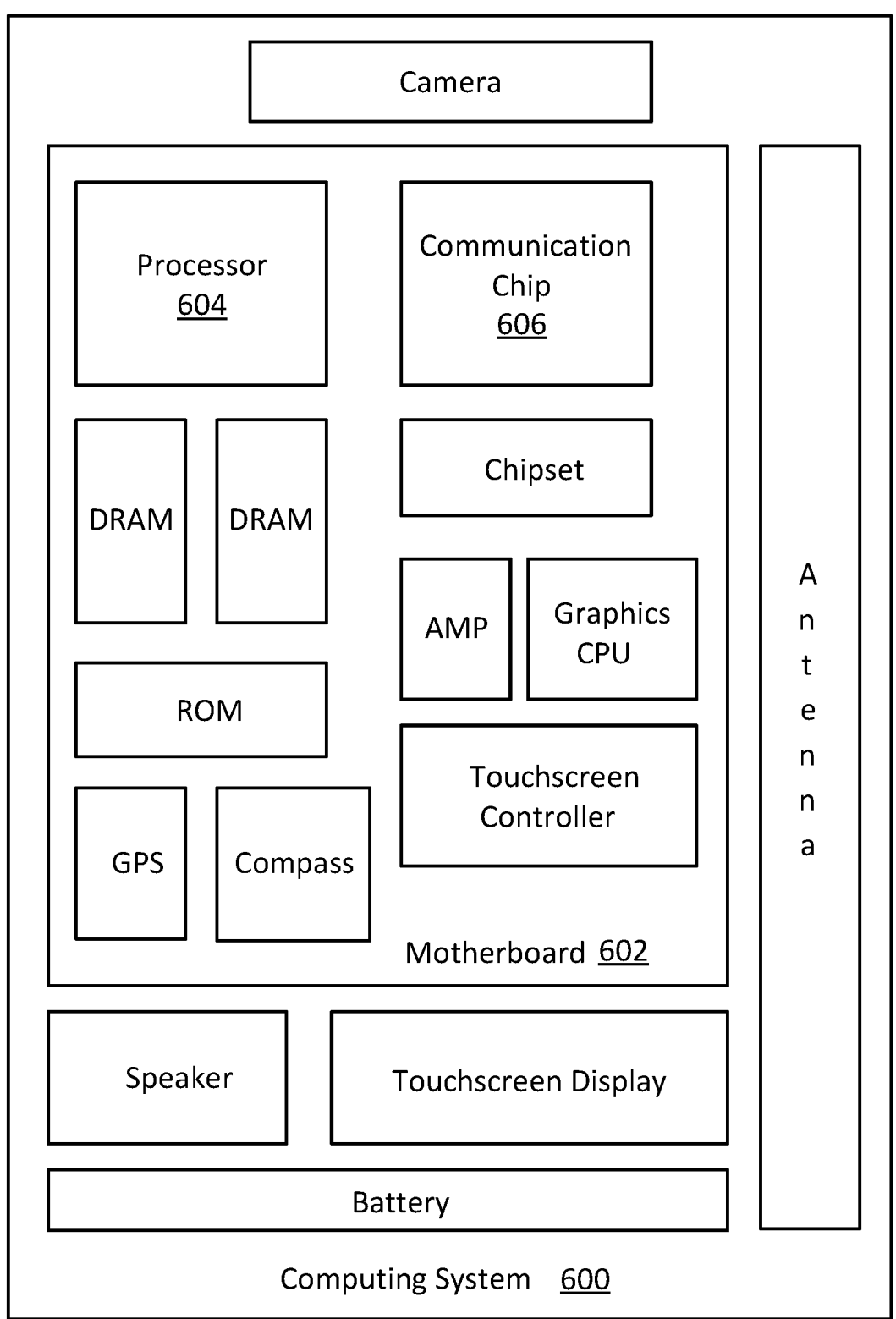
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit having integrated TE devices, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a substrate, a plurality of semiconductor devices on the substrate, and a thermoelectric device integrated into the substrate beneath the plurality of semiconductor devices.

Example 2 includes the subject matter of Example 1, wherein the thermoelectric device comprises first portions of the substrate doped with n-type dopants alternating with second portions of the substrate doped with p-type dopants.

Example 3 includes the subject matter of Example 2, wherein the substrate comprises silicon and the n-type dopants comprise phosphorous and the p-type dopants comprise boron.

Example 4 includes the subject matter of Example 2 or 3, wherein the thermoelectric device comprises a conductive layer coupled between a given first portion of the substrate and an adjacent second portion of the substrate.

Example 5 includes the subject matter of Example 4, wherein the conductive layer comprises tungsten.

Example 6 includes the subject matter of any one of Examples 2-5, wherein the first portions of the substrate include first tail sections and the second portions of the substrate include second tail sections.

Example 7 includes the subject matter of Example 6, further comprising a conductive layer coupled between a first tail section of a given first portion of the substrate and an adjacent second tail section of a given second portion of the substrate.

Example 8 includes the subject matter of any one of Examples 1-7, wherein the plurality of semiconductor devices is a first plurality of semiconductor devices and the thermoelectric device is a first thermoelectric device, and the integrated circuit further comprises a second plurality of semiconductor devices on the substrate, and a second thermoelectric device integrated into the substrate beneath the second plurality of semiconductor devices.

Example 9 includes the subject matter of Example 8, wherein the first thermoelectric device is independently operable from the second thermoelectric device.

Example 10 includes the subject matter of any one of Examples 1-9, wherein the thermoelectric device comprises first material portions doped with n-type dopants alternating with second material portions doped with p-type dopants.

Example 11 includes the subject matter of Example 10, wherein the first material portions and the second material portions comprise bismuth and tellurium.

Example 12 is an integrated circuit package that includes the integrated circuit of any one of Examples 1-11 and a heat spreader thermally coupled to the integrated circuit.

Example 13 includes the subject matter of Example 12, further comprising a heat sink thermally coupled to the heat spreader.

Example 14 includes the subject matter of Example 13, further comprising a package substrate coupled to an opposite side of the integrated circuit from the heat spreader.

Example 15 is a printed circuit board that includes the integrated circuit of any one of Examples 1-11 or includes the integrated circuit package of any one of Examples 12-14.

Example 16 is an integrated circuit that includes a die having a first plurality of semiconductor devices and a second plurality of semiconductor devices, a first thermoelectric device integrated on the die and beneath the first plurality of semiconductor devices, and a second thermoelectric device integrated on the die and beneath the second plurality of semiconductor devices. The first thermoelectric device is independently operable from the second thermoelectric device.

Example 17 includes the subject matter of Example 16, wherein the first and second thermoelectric devices comprise first material portions doped with n-type dopants alternating with second material portions doped with p-type dopants.

Example 18 includes the subject matter of Example 17, wherein the first material portions and the second material portions comprise silicon.

Example 19 includes the subject matter of Example 17, wherein the first material portions and the second material portions comprise bismuth and tellurium.

Example 20 includes the subject matter of any one of Examples 17-19, further comprising a conductive layer coupled between a given first material portion and an adjacent second material portion.

Example 21 includes the subject matter of Example 20, wherein the conductive layer comprises tungsten.

Example 22 is a printed circuit board that includes the integrated circuit of any one of Examples 16-21.

Example 23 is an electronic device that includes a chip package comprising one or more dies and a heat sink structure thermally coupled to one side of the chip package. At least one of the one or more dies includes a substrate, a plurality of semiconductor devices on the substrate, and a thermoelectric device integrated into the substrate beneath the plurality of semiconductor devices. The thermoelectric device is between the plurality of semiconductor devices and the heat sink structure.

Example 24 includes the subject matter of Example 23, wherein the thermoelectric device comprises first portions of the substrate doped with n-type dopants alternating with second portions of the substrate doped with p-type dopants.

Example 25 includes the subject matter of Example 24, wherein the substrate comprises silicon and the n-type dopants comprise phosphorous and the p-type dopants comprise boron.

Example 26 includes the subject matter of Example 24 or 25, wherein the thermoelectric device comprises a conductive layer coupled between a given first portion of the substrate and an adjacent second portion of the substrate.

Example 27 includes the subject matter of Example 26, wherein the conductive layer comprises tungsten.

Example 28 includes the subject matter of any one of Examples 23-27, wherein the plurality of semiconductor devices is a first plurality of semiconductor devices and the thermoelectric device is a first thermoelectric device, and the at least one of the one or more dies further comprises a second plurality of semiconductor devices on the substrate, and a second thermoelectric device integrated into the substrate beneath the second plurality of semiconductor devices.

Example 29 includes the subject matter of Example 28, wherein the first thermoelectric device is independently operable from the second thermoelectric device.

Example 30 includes the subject matter of any one of Examples 23-29, wherein the thermoelectric device comprises first material portions doped with n-type dopants alternating with second material portions doped with p-type dopants.

Example 31 includes the subject matter of Example 30, wherein the first material portions and the second material portions comprise bismuth and tellurium.

Example 32 includes the subject matter of any one of Examples 23-31, further comprising a printed circuit board, wherein the chip package is attached to the printed circuit board.

Example 33 is a method of forming an integrated circuit. The method includes forming a plurality of semiconductor devices on a substrate; doping a first plurality of portions of the substrate with n-type dopants, the first plurality of portions of the substrate being beneath the plurality of semiconductor devices; doping a second plurality of portions of the substrate with p-type dopants, the second plurality of portions of the substrate being beneath the plurality of semiconductor devices and alternating with the first plurality of portions of the substrate; forming alternating pillars of the first plurality of portions of the substrate and the second plurality of portions of the substrate; forming a dielectric layer between the alternating pillars of the first plurality of portions of the substrate and the second plurality of portions of the substrate; and forming a conductive layer coupled between one of the pillars of the first plurality of portions of the substrate and an adjacent pillar of the second plurality of portions of the substrate.

Example 34 includes the subject matter of Example 33, wherein the substrate comprises silicon and the n-type dopants comprise phosphorous and the p-type dopants comprise boron.

Example 35 includes the subject matter of Example 33 or 34, wherein forming the alternating pillars comprises etching the substrate using reactive ion etching (RIE).

Example 36 includes the subject matter of any one of Examples 33-35, wherein forming the alternating pillars comprises forming a tail section of each of the first plurality of portions of the substrate and the second plurality of portions of the substrate.

Example 37 includes the subject matter of Example 36, further comprising forming a conductive layer coupled between the tail section of one of the first plurality of portions of the substrate and an adjacent tail section of one of the second plurality of portions of the substrate.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
a substrate comprising a device portion and a bulk portion, the bulk portion below the device portion and consisting of a semiconductor material;
a plurality of semiconductor devices integrated into and/or on the device portion of the substrate; and
a thermoelectric device integrated into the bulk portion of the substrate beneath the plurality of semiconductor devices, such that the semiconductor material of the bulk portion of the substrate is directly laterally adjacent to the thermoelectric device, wherein the thermoelectric device comprises first portions of the bulk portion of the substrate doped with one or more n-type dopants alternating with second portions of the bulk portion of the substrate doped with one or more p-type dopants, and wherein the first portions of the bulk portion of the substrate include first tail sections, and the second portions of the bulk portion of the substrate include second tail sections;
wherein the substrate is one of a bulk semiconductor substrate or a semiconductor-over-insulator (SOI) substrate.

2. The integrated circuit of claim 1, wherein the semiconductor material of bulk portion of the substrate is silicon, and the one or more n-type dopants comprise phosphorous and the one or more p-type dopants comprise boron, such that the first portions of the bulk portion of the substrate are phosphorus doped silicon, and the second portions of the bulk portion of the substrate are boron doped silicon.

3. The integrated circuit of claim 1, wherein the thermoelectric device comprises a conductive layer coupled between a given first portion of the bulk portion of the substrate and an adjacent second portion of the bulk portion of the substrate.

4. The integrated circuit of claim 1, further comprising a conductive layer coupled between a first tail section of a given first portion of the bulk portion of the substrate and an adjacent second tail section of a given second portion of the bulk portion of the substrate.

5. The integrated circuit of claim 1, wherein the plurality of semiconductor devices is a first plurality of semiconductor devices and the thermoelectric device is a first thermoelectric device, the integrated circuit comprising:
a second plurality of semiconductor devices integrated into and/or on the device portion of the substrate; and a second thermoelectric device integrated into the bulk portion of the substrate beneath the second plurality of semiconductor devices, such that the semiconductor material of the bulk portion of the substrate is directly laterally adjacent to the second thermoelectric device.

6. The integrated circuit of claim 5, wherein the first thermoelectric device is independently operable from the second thermoelectric device.

7. A printed circuit board comprising the integrated circuit of claim 1.

8. An integrated circuit comprising:
a semiconductor-on-insulator (SOI) substrate having a device portion separated from a bulk portion by an insulator layer, the bulk portion consisting of a semiconductor material also included in the device portion, the device portion having a first plurality of semiconductor devices and a second plurality of semiconductor devices;
a first thermoelectric device integrated into the bulk portion of the substrate beneath the first plurality of semiconductor devices; and
a second thermoelectric device integrated into the bulk portion of the substrate beneath the second plurality of semiconductor devices;
wherein each of the first and second thermoelectric devices comprises a first portion of the bulk portion of the substrate doped with n-type dopant and a second portion of the bulk portion of the substrate doped with p-type dopant, and wherein the first portions of the bulk portion of the substrate include first tail sections, and the second portions of the bulk portion of the substrate include second tail sections;
wherein the first thermoelectric device is independently operable from the second thermoelectric device; and
wherein the semiconductor material of the bulk portion of the substrate is directly laterally adjacent to each of the first and second thermoelectric devices.

9. The integrated circuit of claim 8, wherein the first material portions and the second material portions comprise silicon or comprise bismuth and tellurium.

10. The integrated circuit of claim 8, further comprising a conductive layer coupled between a given first material portion and an adjacent second material portion.

11. A printed circuit board comprising the integrated circuit of claim 8.

12. An electronic device, comprising:
a chip package comprising one or more dies, at least one of the one or more dies comprising a substrate having a semiconductor device portion over a bulk portion, the bulk portion consisting of a semiconductor material also included in the semiconductor device portion, the semiconductor device portion having a plurality of semiconductor devices, and
a thermoelectric device integrated into a bulk portion of the substrate beneath the plurality of semiconductor devices, the semiconductor material of the bulk portion of the substrate being directly laterally adjacent to the thermoelectric device, wherein the thermoelectric device comprises a first portion of the bulk portion of the substrate doped with n-type dopant and a second portion of the bulk portion of the substrate doped with p-type dopant, and wherein the first portion of the bulk portion of the substrate includes a first tail section, and the second portion of the bulk portion of the substrate includes a second tail section; and
a heat sink structure thermally coupled to one side of the chip package, such that the thermoelectric device is between the plurality of semiconductor devices and the heat sink structure.

13. The electronic device of claim 12, wherein the semiconductor material of the bulk portion of the substrate is silicon, and the n-type dopant comprises phosphorous and the p-type dopant comprises boron, such that the first portion of the bulk portion of the substrate is phosphorus doped silicon, and the second portion of the bulk portion of the substrate is boron doped silicon.

14. The electronic device of claim 12, wherein the thermoelectric device comprises a conductive layer coupled between the first portion of the bulk portion of the substrate and the second portion of the bulk portion of the substrate.

15. The electronic device of claim 12, wherein the plurality of semiconductor devices is a first plurality of semiconductor devices and the thermoelectric device is a first thermoelectric device, the at least one of the one or more dies comprising:
a second plurality of semiconductor devices on the substrate; and
a second thermoelectric device integrated into the bulk portion of the substrate beneath the second plurality of semiconductor devices.

16. The electronic device of claim 15, wherein the first thermoelectric device is independently operable from the second thermoelectric device.

* * * * *